United States Patent
Abbott et al.

(10) Patent No.: US 6,833,774 B2
(45) Date of Patent: Dec. 21, 2004

(54) SURFACE ACOUSTIC WAVE FILTER

(75) Inventors: Benjamin P. Abbott, Orlando, FL (US); Natalya F. Naumenko, Moscow (RU)

(73) Assignee: Sawtek, Inc., Orlando, FL (US)

( * ) Notice: Subject to any disclaimer, the term of this patent is extended or adjusted under 35 U.S.C. 154(b) by 0 days.

(21) Appl. No.: 10/414,058

(22) Filed: Apr. 15, 2003

(65) Prior Publication Data

US 2003/0234705 A1 Dec. 25, 2003

Related U.S. Application Data

(60) Provisional application No. 60/391,447, filed on Jun. 25, 2002.

(51) Int. Cl.$^7$ ............................ H03H 9/16; H01L 41/08
(52) U.S. Cl. .................................... 333/193; 310/313 A
(58) Field of Search ....................... 310/313 A, 313 B, 310/313 D; 333/193–196

(56) References Cited

U.S. PATENT DOCUMENTS

| | | | |
|---|---|---|---|
| 5,698,927 A | * 12/1997 | Tanaka et al. | 310/313 A |
| 6,037,847 A | * 3/2000 | Ueda et al. | 333/193 |
| 6,153,091 A | * 11/2000 | Sechrist et al. | 208/139 |
| RE37,375 E | 9/2001 | Satoh et al. | 333/193 |
| 6,556,104 B2 | * 4/2003 | Naumenko et al. | 333/193 |
| 6,661,313 B2 | * 12/2003 | Naumenko et al. | 333/193 |
| 6,717,327 B2 | * 4/2004 | Kando et al. | 310/313 A |

OTHER PUBLICATIONS

A. Isobe, M. Hikita, K. Asai; "Propagation Characteristics of Longitudinal Leaky SAW in Al–Grating Structure," IEEE Transactions on Ultrasonics, Ferroelectrics, and Frequency Control, vol. 46, No. 4, Jul. 1999; pp. 849–855.

J. Kushibiki, I. Takanaga, M. Arakawa, T. Sannomiya; Accurate Measurements of the Acoustical Physical Constants of LiNbO$_3$ and LiTaO$_3$ Single Crystals, IEEE Transactions on Ultrasonics, Ferroelectrics, and Frequency Control, vol. 46, No. 5, Sep. 1999; pp. 1315–1323.

* cited by examiner

*Primary Examiner*—Dinh T. Le
(74) *Attorney, Agent, or Firm*—Allen, Dyer, Doppelt, Milbrath & GilChrist, P.A.

(57) ABSTRACT

A SAW filter includes a piezoelectric substrate of a single crystal LiNbO$_3$ and SAW resonators having an electrode thickness ranging from about 8% to about 9% of an acoustic wavelength of a high velocity SAW excited on the surface of the substrate. The piezoelectric substrate has an orientation defined by Euler angles ($\lambda$, $\mu$, $\theta$), with angle $\lambda$ in a range from −5° to +5°, angle $\mu$ in a range from about 75° to about 85°, and angle $\theta$ in a range from 85° to 95°. A metalization ratio for the resonators ranges from about 0.3 to about 0.9, with resonators in a parallel arm of the filter having a metalization ratio from 1.1–1.4 times larger than the metalization ratio for resonators in the series arm of the filter. Such orientations simultaneously combined with an optimized electrode thickness and optimized metalization ratios provide an improved performance in RF applications.

17 Claims, 16 Drawing Sheets

SURFACE ACOUSTIC WAVE FILTER

CROSS-REFERENCE TO RELATED APPLICATIONS

This application incorporates by reference and claims priority benefit of application Ser. No. 60/391,447 for "Surface Acoustic Wave Devices Using High-Velocity Pseudo-Surface Waves", filed Jun. 25, 2002 and commonly owned with the present application.

FIELD OF THE INVENTION

The present invention relates generally to surface acoustic wave (SAW) devices and more particularly to a saw device having improved performance characteristics for application to radio frequency (RF) filtering for wireless communications.

BACKGROUND OF THE INVENTION

Surface acoustic wave (SAW) filters with resonant structures are used extensively for radio frequency (RF) filtering in wireless communication systems due to the small chip size and low insertion loss that can be realized in such filters. A high operating frequency requires a high propagation velocity of saw in a piezoelectric substrate, combined with strong piezoelectric coupling. In particular, rotated y-cuts of lithium niobate ($LiNbO_3$) single crystals provide propagation velocities of surface waves up to 4700 m/s and electromechanical coupling coefficients $k^2$ up to 17% if the propagation direction is parallel to x-axis of a crystal. Such orientations are characterized by the Euler angles $(0°, \mu, 0°)$. Therefore, these substrates are widely used in RF filters in spite of certain attenuation caused by a leaky nature of propagating surface waves. The attenuation of pseudo-surface (leaky) acoustic waves (PSAW) is usually minimized as a result of an appropriate choice of crystal orientation and thickness of metal electrodes.

The existing tendency to increase operating frequencies in communications systems is followed by an increasing interest in high velocity pseudo-surface waves (HVPSAW) with propagation velocities up to 7000 m/s. In general, HVPSAW are more strongly attenuated than low-velocity PSAW. With a proper choice of a substrate, orientation and electrode thickness propagation loss can be reduced. By way of example, low attenuated HVPSAW with propagation velocities of 6000–6500 m/s and a high electromechanical coupling coefficient can exist in rotated y-cuts of $LiNbO_3$ with periodic grating of Al electrodes if the propagation direction lies in the YZ-plane of a crystal. Such orientations are described by the Euler angles $(0°, \theta, 90°)$. Reference can be made to Isobe (a. Isobe et al, IEEE trans. Ultrason., Ferroelect., Freq. Control, 1999, v.46, no 4, pp. 849–855) who reported that HVPSAW with negligible propagation loss exists in a 171° YZ' cut of $LiNbO_3$ with periodic grating of Al electrodes if a normalized thickness of electrodes is about 8.3% $\Lambda$, where $\Lambda$ is HVPSAW wavelength. This orientation can be characterized by the Euler angles $(0°, 81°, 90°)$.

According to the theoretical characteristics of HVPSAW which propagate in a 171° YZ' cut of $LiNbO_3$ with Al grating of thickness 8.3% $\Lambda$, as reported in Table 1 of the Isobe paper, a saw resonator shows maximum Q-factor at a resonant frequency, $Qr=126,000$. At an anti-resonant frequency, the calculated Q-factor was reported to be much smaller, $Qa=3,840$. From the description of experimental structure of saw resonators used by Isobe for Q-factor measurements, it follows that a metalization ratio (electrode width to period of grating structure) was assumed to be 0.5. In other words, Isobe et al. teaches a fixed metalization ratio and seeks a maximum Q-factor at a resonance frequency.

In many applications, the center frequency of a passband lies between resonant and anti-resonant frequencies of saw resonators that compose the filter structure. By way of example, resonant saw structures in ladder filters are used as both series and as parallel (shunt) components within a composite device structure, which may include lattice-like regions. In a typical ladder filter, the anti-resonant frequency of the parallel (shunt) elements and the resonant frequency of the series elements generally reside within the passband of the filter. In such a filter, the lower passband edge of the filter is shaped by the resonance of the parallel (shunt) elements and the upper passband edge is shaped by the anti-resonance of the series elements.

SUMMARY OF THE INVENTION

In view of the foregoing background, the present invention seeks to provide a piezoelectric substrate with an optimum crystal orientation for use in high radio frequency (RF) SAW devices, which can overcome the disadvantages of known substrate orientations. In addition, embodiments of the present invention as herein described by way of example, provide a filter with improved performance. Insertion loss is reduced and a shape factor improved for SAW filters comprising resonator-type elements that are built on an optimal orientation of $LiNbO_3$ with Al grating of optimal thickness, by utilizing different metalization ratios in different resonator elements. Where different metalization ratios allow the propagation loss for each individual resonator to be minimized at predetermined individual frequencies, it is desirable to minimize the propagation loss of the shunt resonator elements that form the lower passband skirt at their resonant frequencies. It is also desirable to minimize the propagation loss at the anti-resonant frequency of the series elements that form the high frequency skirt of the series resonator elements. In yet other cases, it is desirable to minimize the loss of resonator elements at frequencies that result in minimizing the insertion loss of the filter.

The present invention may include a SAW device comprising resonator elements with improved performance due to utilizing orientations of $LiNbO_3$ with simultaneously optimized propagation loss at resonant, anti-resonant, or frequencies in between, while the electrode thickness varies in a range from 8% $\Lambda$ to 9% $\Lambda$ ($\Lambda$ herein defined as the acoustic wavelength). Further, the metalization ratio may be varied within the interval from 0.3 to 0.9.

The present invention may provide a SAW device comprising a piezoelectric substrate of a single crystal $LiNbO_3$ with electrode patterns disposed on a surface of said piezoelectric substrate and forming resonator-type elements, wherein a thickness of electrode patterns are in the range from 8% to 9% $\Lambda$ and Al is used as a primary component of electrode material, and wherein a piezoelectric substrate has orientation defined by the Euler angles $(\lambda, \mu, \theta)$, with angle $\lambda$ in the range from −5° to +5°, angle $\mu$ in the range from 75° to 85°, and angle $\theta$ in the range from 85° to 95°. Further, a metalization ratio of the electrode patterns of resonator-type elements may be in the range from 0.3 to 0.9. Yet further, the metalization ratios of individual resonators may be varied to allow the propagation loss for each individual resonator to be minimized at predetermined individual frequencies.

In general, the metalization ratios of resonators, which shape the lower stop band edge, may be selected to minimize the propagation loss in the vicinity of the filter's lower frequency skirt (i.e. at a resonant frequency of elements). Yet further, the metalization ratio of the resonator elements, which form the upper pass band skirt, may be selected to minimize the propagation loss in the vicinity of the upper stop band edge (i.e. at the anti-resonant frequency for the resonator). In cases of resonator elements, which do not primarily shape the pass band edges, it is desirable to minimize the loss of said resonator element at a frequency that will result in minimizing the insertion loss of the filter, wherein the magnitude of the variation between the values of the metalization ratios of the individual resonator elements exceeds 0.05.

BRIEF DESCRIPTION OF THE DRAWINGS

Preferred embodiments of the invention as well as alternate embodiments are described by way of example with reference to the accompanying drawings in which.

DETAILED DESCRIPTION OF THE PREFERRED EMBODIMENTS

The present invention will now be described more fully hereinafter with reference to the accompanying drawings, in which preferred embodiments of the invention are shown. However, this invention may be embodied in many different forms and should not be construed as limited to the embodiments set forth herein. Rather, these embodiments are provided so that this disclosure will be thorough and complete, and will fully convey the scope of the invention to those skilled in the art.

Figures 1A, 1B:
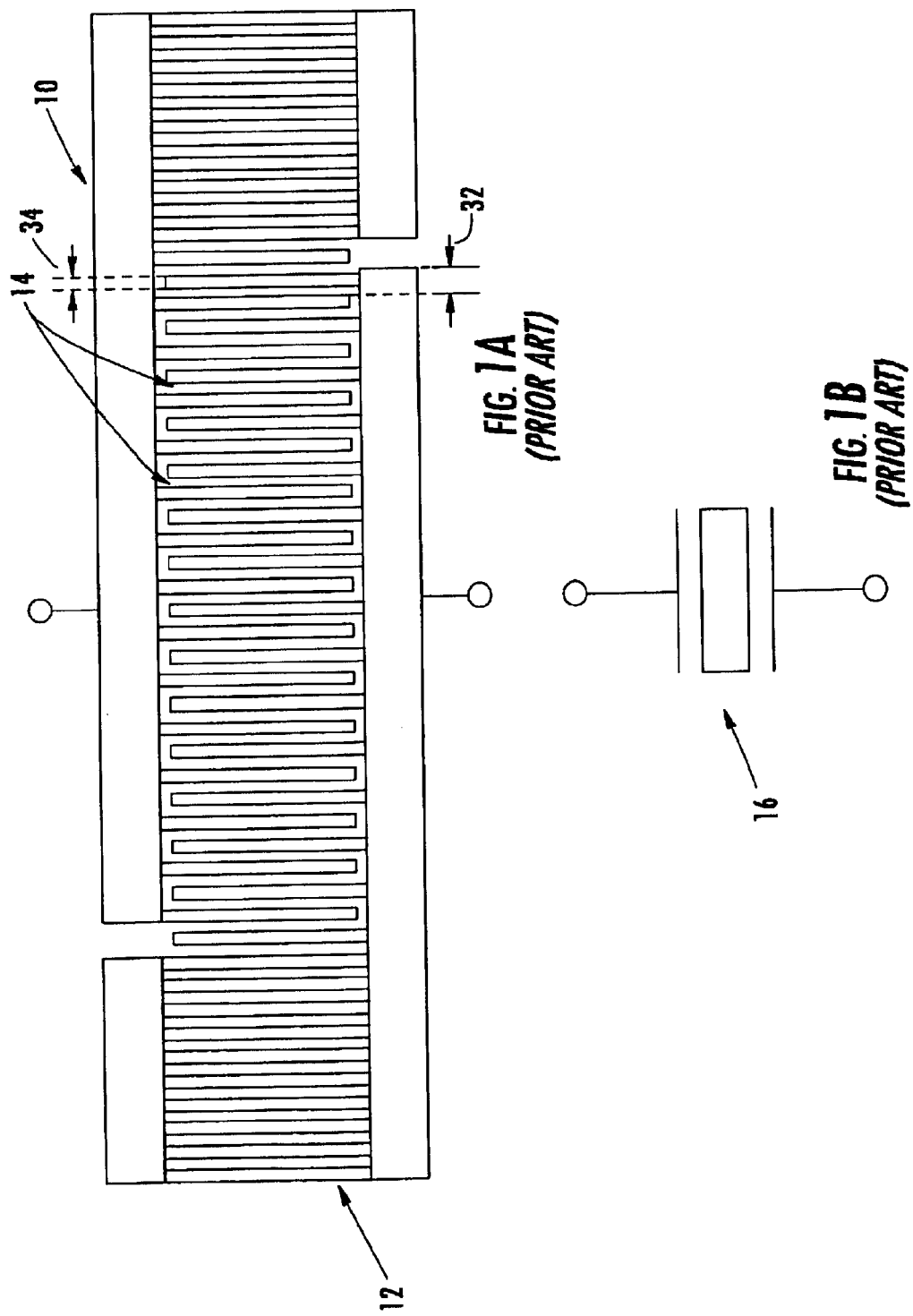
FIGS. 1A and 1B illustrate one version of a saw resonator and the electrical symbol, respectively, commonly used to represent resonators with such electrical characteristics.
Figure 2A:
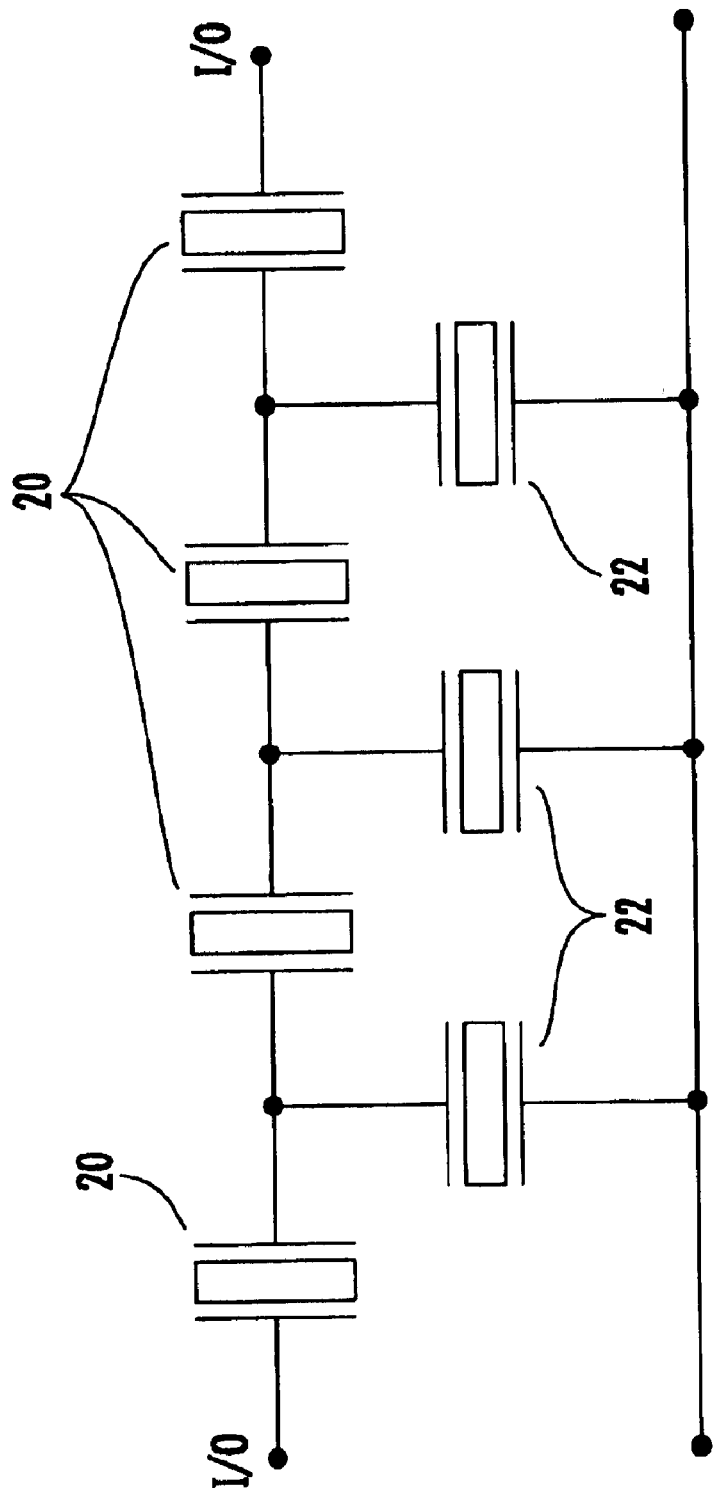
FIG. 2A illustrates a known ladder filter constructed of series and shunt SAW resonators using the electronic symbols.
Figure 2B:
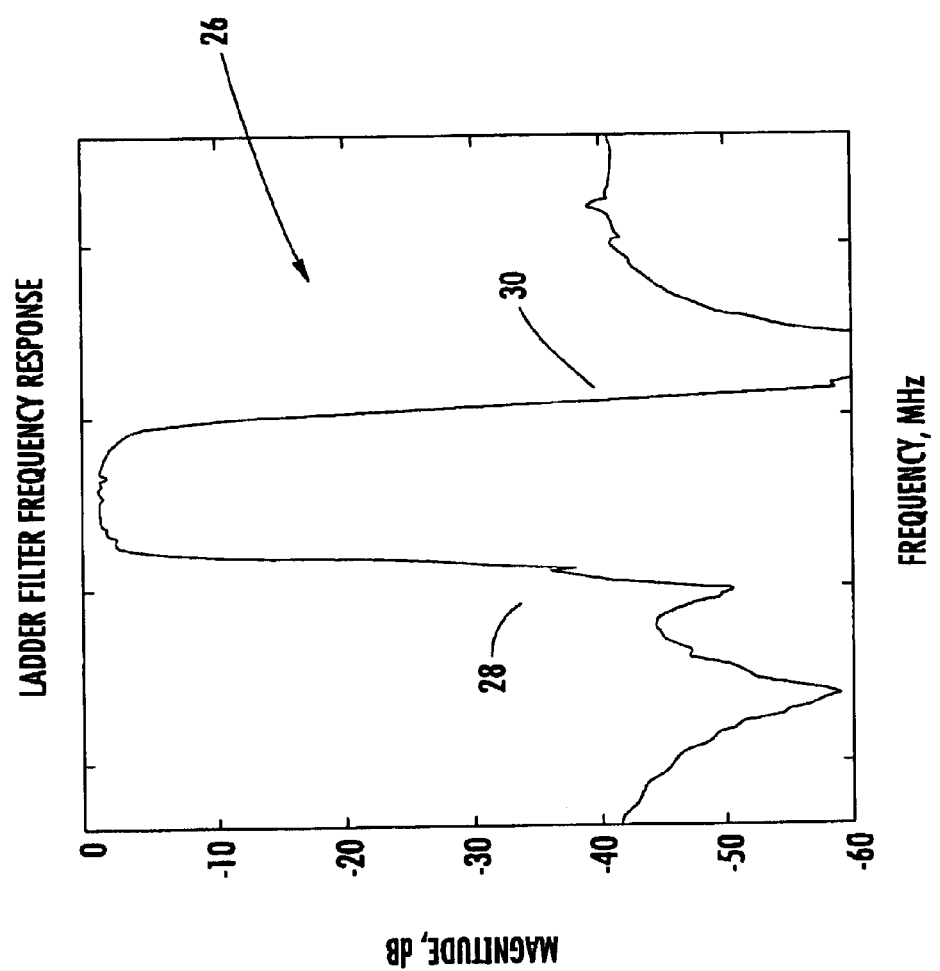
FIG. 2B is a graph illustrating a SAW filter characteristic curve.
Figure 2C:
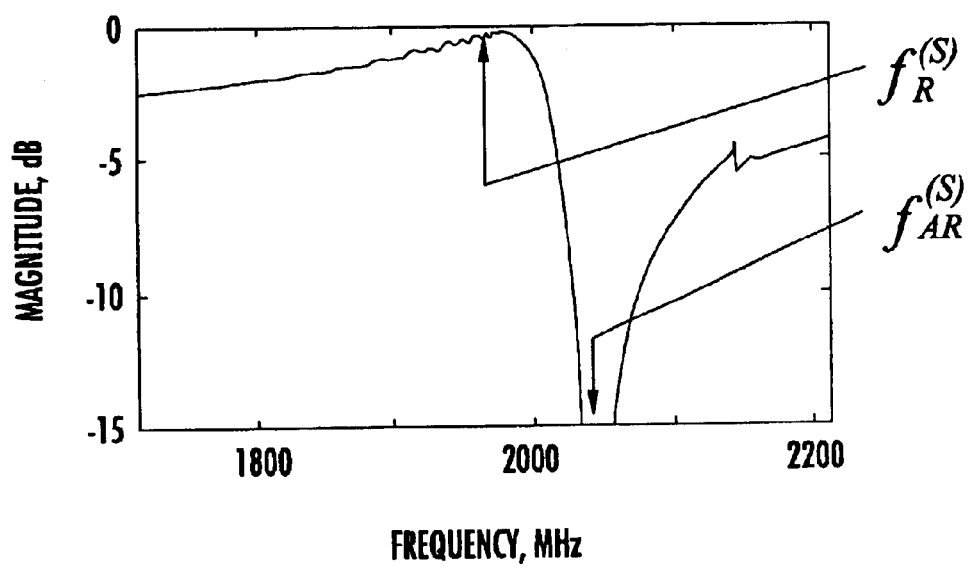
FIGS. 2C and 2D illustrate frequency characteristics of the series "S" and parallel "P" elements, respectively, for resonance "R" and anti-resonance "AR" frequencies thereof.
Figure 2D:
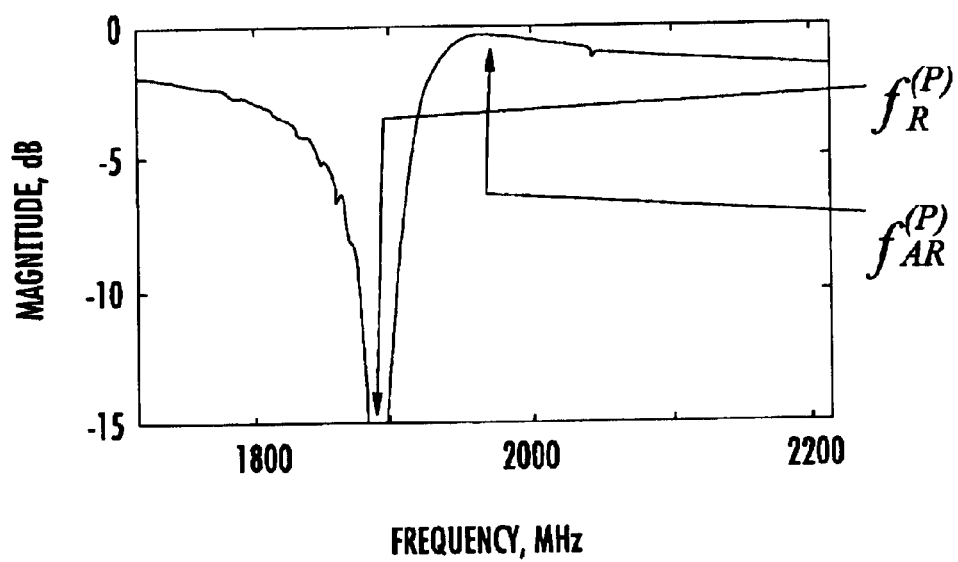

By way of a brief review and as earlier described for known applications, the center frequency of a passband lies between resonant and anti-resonant frequencies of SAW resonators such as the SAW resonator 10 illustrated, by way of example, with reference to FIG. 1A, which compose a filter structure 12 having interdigitized finger elements 14 also represented by an electrical symbol 16 illustrated with reference to FIG. 1B. By way of further example and as illustrated with reference to FIG. 2A, in a ladder filter 18, the SAW filter structure 12 is used for both a series component 20 in a series arm 21 and as parallel (shunt) components/elements 22 in a parallel arm 23 within a composite device structure such as the ladder filter 18 herein shown. In a typical ladder filter 18, the anti-resonant frequency of the parallel (shunt) elements 22 and the resonant frequency of the series elements 20 generally reside within the passband of the filter. In such a filter 18 and as in its filter characteristic curve 26 illustrated with reference to FIG. 2B, the lower passband edge 28 of the filter is shaped by the resonance of the parallel (shunt) elements 22 and the upper passband edge 30 is shaped by the antiresonance of the series elements 20. The frequency characteristics of the series "S" and parallel "P" elements are further illustrated with reference to FIGS. 2C and 2D, respectively, for resonance "R" and anti-resonance "AR" frequencies thereof. To obtain steep passband edges and thus improve the shape factor in such filters, it is desirable to minimize propagation loss at resonance for parallel (shunt) resonators and at anti-resonance for series resonators. In contrast, minimum insertion loss at the center frequency of such filters can be obtained if propagation loss is minimized at anti-resonance for parallel (shunt) resonators and at resonance for series resonators.

Figure 2E:
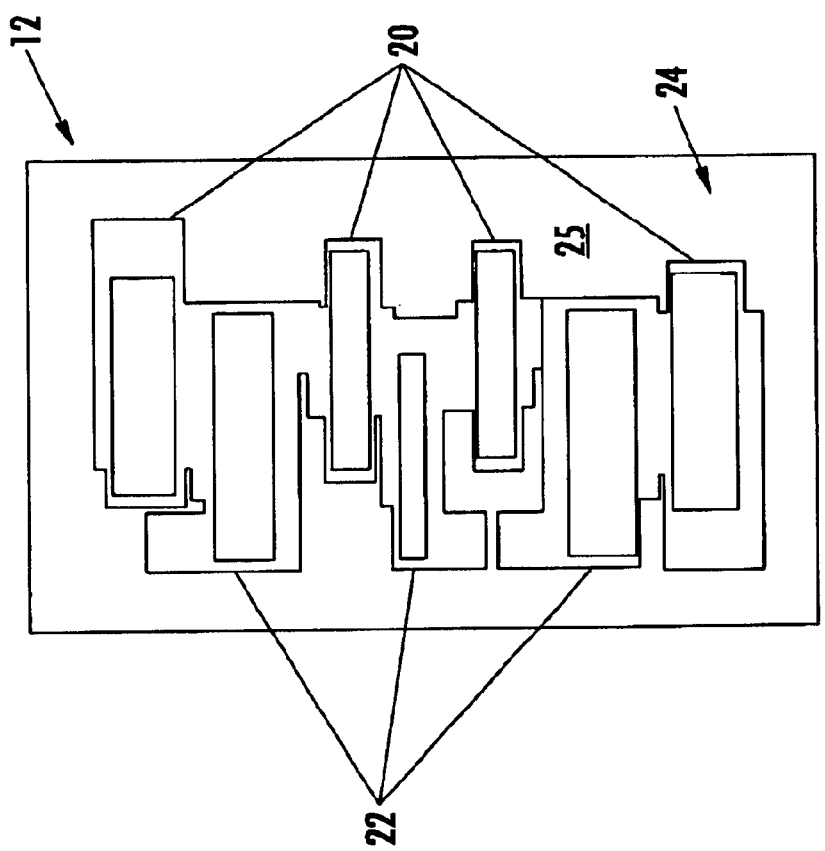
FIG. 2E is a diagrammatical illustration of one ladder filter embodiment for the electronic diagram of FIG. 2A in keeping with the teachings of the present invention.
Figure 2F:
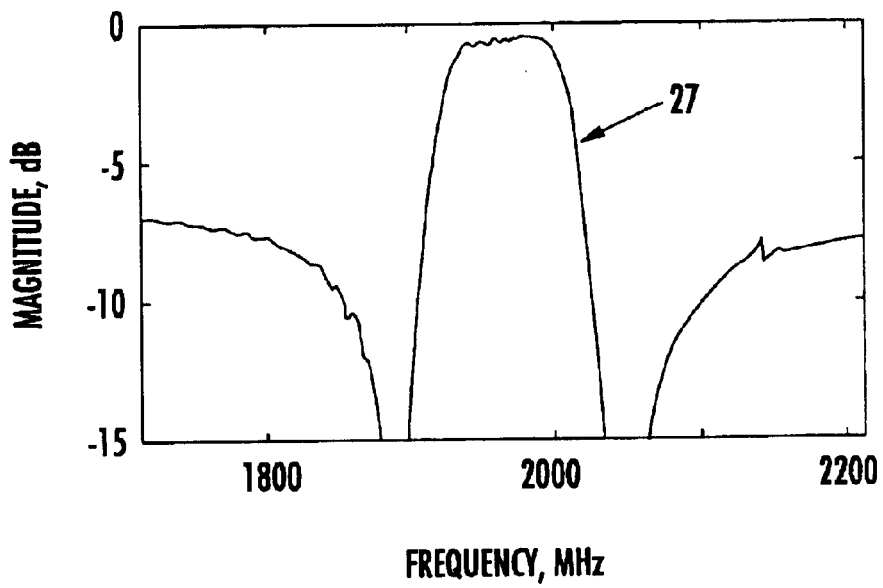
FIG. 2F is a frequency response (characteristic curve) for a two element ladder filter having single series and parallel elements.
Figure 2G:
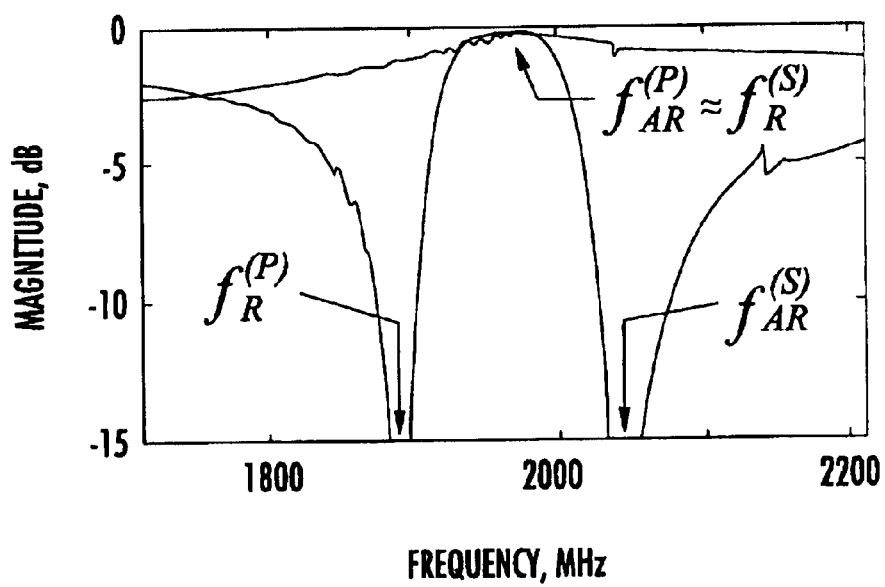
FIG. 2G is frequency response illustrating one desirable ladder filter characteristic curve resulting from an optimizing of combined frequency responses of series and parallel positioned resonators, respectively, wherein both resonance and anti-resonance characteristics are considered.

More generally, and as illustrated with reference to FIG. 2E, a composite device filter 12 may include several resonators carried on the substrate 24 in a series arm, series resonator 20 and/or in a parallel arm, parallel resonator 22 of the filter, some of which determine the level of rejection in a stop band and others provide steep passband edges. An electrical equivalent is illustrated herein, by way of example, with reference to FIG. 2F. As herein discussed, it is desirable to provide a filter frequency response 27 as illustrated by way of example with reference to FIG. 2B. This will include selecting an appropriate resonance frequency and anti-resonance frequency for at least one element within the series or parallel arms and combining such, as illustrated with reference to FIG. 2G, to provide such a desired characteristic response. With reference to FIG. 2G by way of further example, the resonator frequencies may be shifted slightly such that the series elements frequency resonance(s) coincide(s) with the parallel element(s) anti-resonance(s). One requirement for improving propagation loss of each element resonator depends on the device structure but commonly minimum propagation loss is required either at about resonance and at about anti-resonance.

Figure 3A:
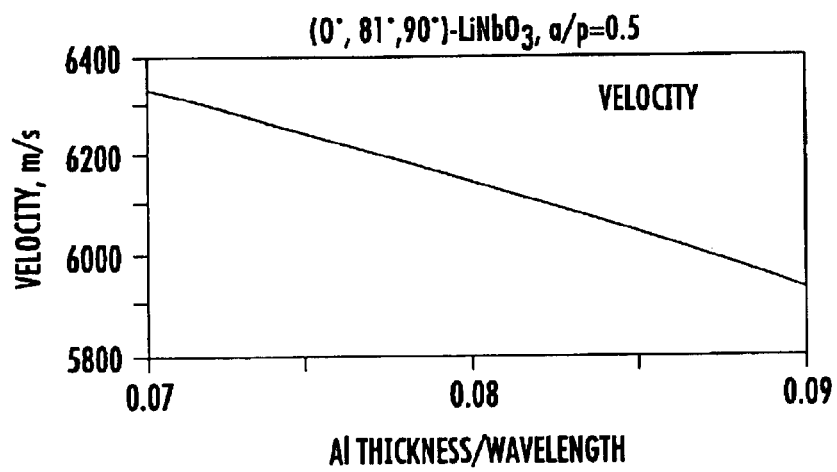
FIGS. 3A, 3B, and 3C graphically illustrate velocity, propagation loss estimated at resonant and at anti-resonant frequencies, and electromechanical coupling coefficient, respectively, of a HVPSAW as functions of Al electrode thickness normalized to wavelength, in 171° YZ' cut of LiNbO$_3$ [Euler angles (0°, 81°, 90°)], with periodic Al electrode grating, and metalization ratio a/p=0.5 in keeping with the teachings of the present invention.
Figure 3B:
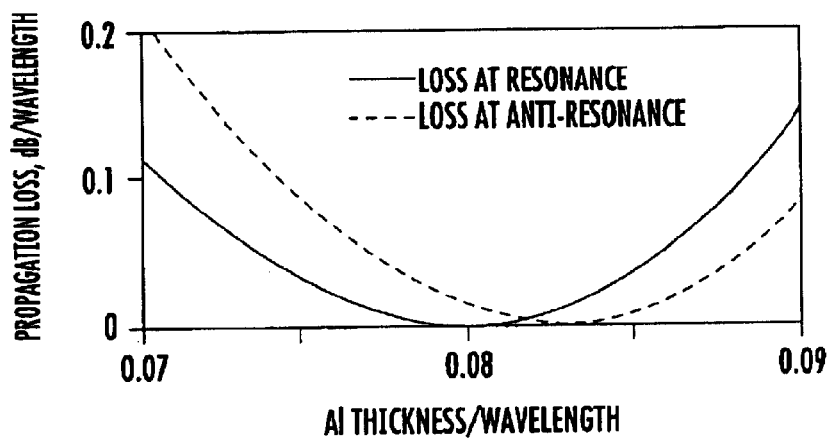
Figure 3C:
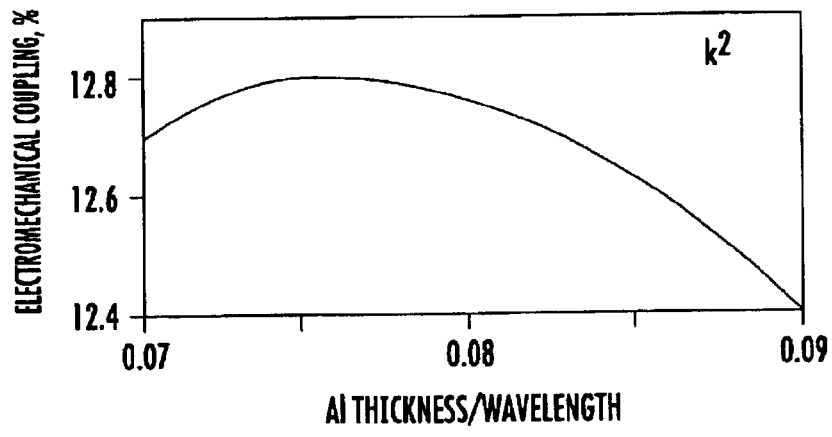

In developing embodiments of the present invention, various characteristic properties of SAW filters were considered. By way of example, consider FIGS. 3A, 3B, and 3C illustrating calculated velocity, propagation loss estimated at resonance and at anti-resonance, and electromechanical coupling coefficient of HVPSAW, respectively, versus normalized Al electrode thickness, in a 171° YZ' cut of $LiNbO_3$ with a periodic Al electrode grating. A HVPSAW velocity V has been calculated from a resonance frequency of a SAW resonator $f_r$, as $V=2*p*f_r$, where "p" is the period 32 of the electrode/filter structure 12 illustrated again with reference to FIG. 1A. With "a" being the electrode width 34, a constant metalization ratio a/p, which is assumed to be 0.5, propagation loss $L_r$, estimated at resonant frequency, is minimal and negligible at an Al thickness of h=8% Λ. With a propagation loss $L_a$, estimated at anti-resonant frequency, the metalization ratio is minimal and negligible at an Al thickness h=8.3% Λ. By way of example, these and other calculations for the present invention were made with material constants of $LiNbO_3$ reported by Kushibiki (J. Kushibiki et al., IEEE Trans. Ultrason., Ferroelect., Freq. Control, 1999, v.46, No. 5, pp. 1315–1323).

It was determined that the results do not change significantly with other sets of material constants. For example, with the constants reported by Warner (A. Warner et al, J. Acoust. Soc. Amer., 1967, v.42, pp. 1223–1231) $L_r$ has a minimum value at h=8.2% Λ and $L_a$ is minimal at h=8.5% Λ. Another set of $LiNbO_3$ constants reported by Kovacs (G. Kovacs et al. Proc. 1990 IEEE Ultrasonics Symposium, pp.435–438), illustrates results that are close to that obtained with Kushibiki's constants. However, with any material constants, the calculations show that different Al thicknesses are required to simultaneously minimize propagation loss at resonance and at anti-resonance. Though it is possible to manufacture SAW devices with different electrode thickness in resonator elements, it may not be practical due to the higher cost of such devices.

Figure 4A:
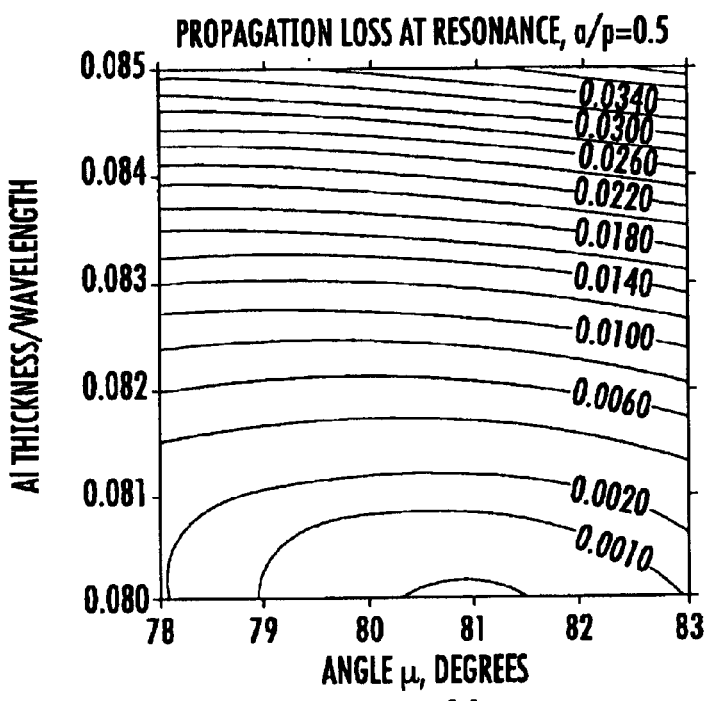
FIGS. 4A and 4B illustrate propagation loss estimated at resonant and at anti-resonant frequencies, respectively, in orientations of LiNbO$_3$ defined by the Euler angles (0°, $\mu$, 90°), as functions of the Euler angle $\mu$ and normalized Al electrode thickness h/Λ, and metalization ratio a/p=0.5.
Figure 4B:
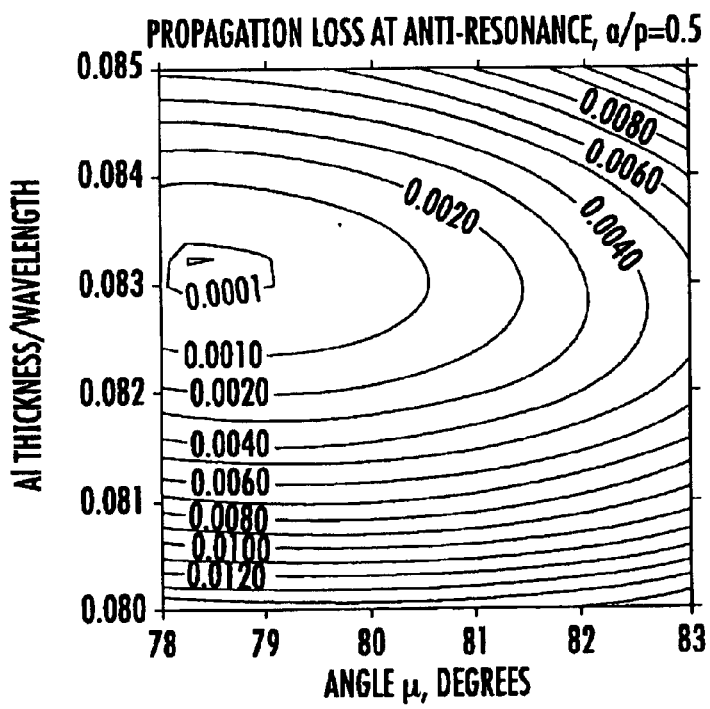

FIGS. 4A and 4B illustrate contour plots of propagation loss, estimated at resonant and at anti-resonant frequencies, respectively, in orientations of $LiNbO_3$ defined by the Euler angles (0°, $\mu$, 90°), as functions of the Euler angle $\mu$ and normalized Al electrode thickness h/Λ. Calculations were made with a metalization ratio of 0.5. A minimum propagation loss, which is less than 0.0001 dB/Λ, occurs at some combination of angle $\mu$ and normalized thickness h/Λ. This combination is different for a propagation loss estimated at resonance and at anti-resonance: $\mu$=81°, h=8% Λ and $\mu$=78.5°, h=8.3% Λ, respectively.

The behavior of propagation loss in the two-dimensional space ($\mu$, h/Λ) that is illustrated with reference again to FIGS. 4A and 4B, with a minimum existing at certain points, is typical for HVPSAW and different from that of a PSAW. The latter exhibits the optimal line of orientation versus normalized electrode thickness. Hashimoto was first to report about such dependence in rotated YX-cuts of $LiTaO_3$ and $LiNbO_3$ (K. Hashimoto et al, Proc. 1997 Ultrasonics Symposium, pp.245–254). Therefore, the propagation loss of PSAW can be minimized for any electrode thickness within a wide interval if an optimal cut angle is selected. By way of example, with increasing velocity, the number of bulk waves which contribute to the pseudo-surface wave structure being responsible for its attenuation increases from one to two. Consequently, to provide zero propagation loss for a HVPSAW, two bulk wave contributions must vanish simultaneously. Therefore, non-attenuated HVSAW can exist in symmetric orientations only, when one of the bulk waves is uncoupled due to symmetry, and at a certain thickness of uniform film or electrode grating. Examples of such symmetric orientations include $LiNbO_3$ cuts defined by the Euler angles (0°, $\mu$, 90°). Moreover, these orientations for HVPSAW, which have quasi-longitudinal polarization, may potentially exhibit maximum piezoelectric coupling with tangential electric field in the grating. This is confirmed by high $k^2$ values ($k^2$=12.4%-12.8%) as illustrated with reference again to FIGS. 3A–3C, and by further results presented hereinafter.

Figure 5:
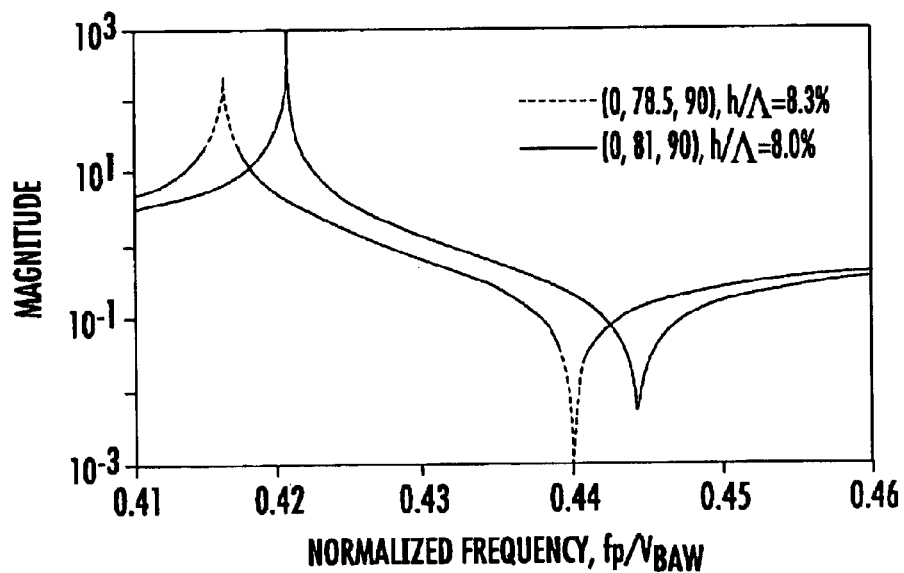
FIG. 5 illustrates amplitude of strip admittance of an infinite periodic grating with metalization ratio a/p=0.5 versus normalized frequency f=fp/V$_{BAW}$, where p is a period of a grating and V$_{BAW}$ is the bulk wave velocity, and including two curves referring to the optimal combinations of orientation and normalized al thickness which follow from FIGS. 4A and 4B and provide minimum propagation loss at resonant and at anti-resonant frequencies.

Two curves shown in FIG. 5 refer to optimal orientations, (0°, 78.5°, 90°) and (0°, 81°, 90°), which follow from FIGS. 4A and 4B, with optimized values of normalized Al thickness, 8.3% Λ and 8% Λ, respectively. The amplitude of strip admittance is shown as a function of normalized frequency f'=fp/$v_{BAW}$, where $v_{BAW}$ is the bulk wave velocity (7317 m/s and 7321 m/s, respectively). With the first optimal combination of orientation and thickness, the calculated values of Q-factors at resonance and at anti-resonance are $Q_r$=1300 and $Q_a$=4*10$^5$, respectively. With the second optimal orientation/thickness combination, $Q_r$=1.9*10$^6$ and $Q_a$=1100.

Calculations performed with a different metalization ratio have show that with variation of this parameter the deep minimum of propagation loss (less than 0.0001 dB/Λ) shifts but does not disappear. As a result, it is possible to minimize propagation loss simultaneously at the resonant frequency of a first resonator and at the anti-resonant frequency of a second resonator, using different metalization ratios, while orientation and electrode thickness are the same in both resonators.

Figure 6:
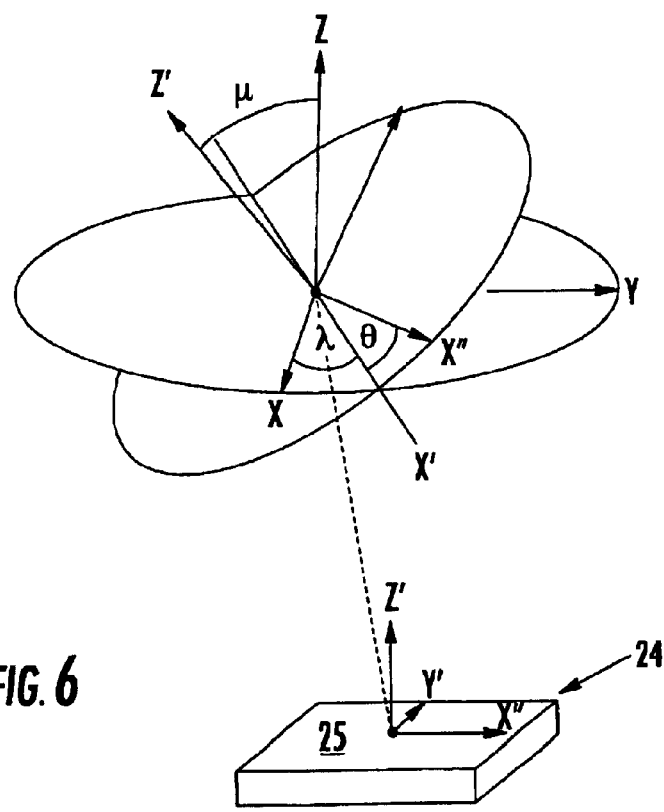
FIG. 6 diagrammatically illustrates orientation of a crystal plane and propagation direction in the plane using Euler angles with reference to initial crystal axes X, Y, Z.

Now consider an orientation procedure defining a substrate cut and propagation direction of LSAW within this cut according to the specified Euler angles (λ, μ, θ) as illustrated with reference is FIG. 6. With initial coordinate axes X, Y, Z fixed along crystal axes of a LiNbO$_3$ crystal substrate 24 according to the Euler angle convention, first, auxiliary axis X' (positive direction) is obtained by rotation from positive X axis towards positive Y axis by the angle λ. The outward normal to the substrate cut Z' is then found by rotation about auxiliary axis X' from positive Z axis, by the angle μ counter-clockwise, as viewed from positive X'. Finally, the direction of surface wave propagation X" on propagation surface 25 is found by rotation about Z' from positive X' axis by the angle θ counterclockwise, as viewed from positive Z' axis.

Consider that the performance of a SAW filter, comprising a piezoelectric substrate with electrode patterns used for generation and detection of surface waves and forming resonators, generally depends on the propagation characteristics of SAW in a substrate. By way of example, if a pseudo-surface wave (PSAW) or high velocity pseudo-surface wave (HVPSAW) is utilized in a SAW device, the propagation velocity of such a wave is higher than that of a common SAW, which is advantageous for high-frequency applications. However, the propagation loss, which is caused by radiation of bulk waves into the bulk of a substrate, affects insertion loss, shape factor, and other important parameters of a SAW filter.

By way of continuing example, for a specified substrate cut and propagation direction, propagation loss depends on features of the filter structure, such as metalization ratio and electrode thickness normalized to wavelength (h/Λ). Studies were conducted assuming with electrode patterns containing Al as a primary component, with metalization ratios (a/p) varying between 0.2 and 0.9, and with a range of normalized electrode thickness spanning from 7.5% Λ to 9.5% Λ. As a criterion of optimization, minimization of propagation loss at resonant frequencies, at anti-resonant frequencies, or frequencies in between, was used, and may be achieved due to the variation in metalization ratios, while the substrate orientation and normalized electrode thickness are set equal and optimized.

Figure 7A:
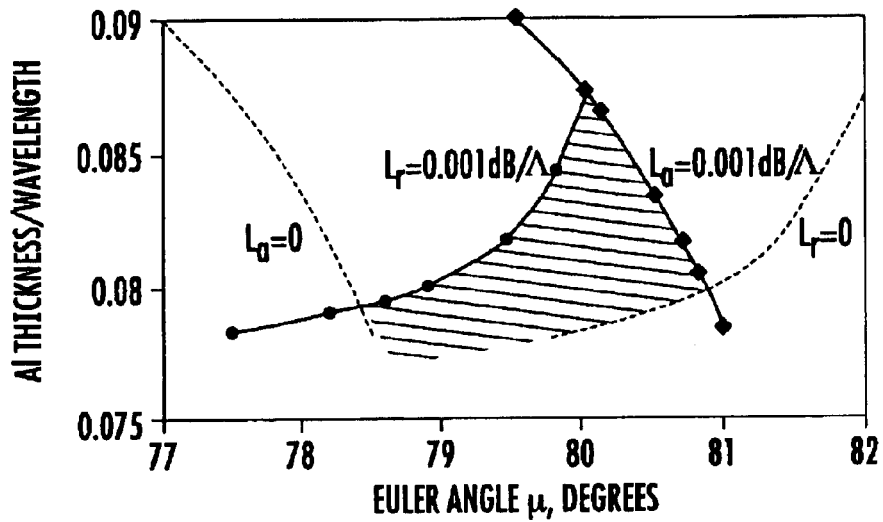
FIGS. 7A and 7B graphically illustrate dependence between the optimal values of three parameters including Euler angle $\mu$, normalized Al thickness h/Λ, and metalization ratio a/p, which provide zero or 0.001 dB/Λ propagation loss of HVPSAW at resonant and at anti-resonant frequencies in the orientations of LiNbO$_3$ defined by the Euler angles (0°, $\mu$, 90°), and further illustrate propagation losses (in shaded area) at resonance and at anti-resonance are less than 0.001 dB/Λ, wherein a determination of optimal metalization ratios that provide minimum propagation loss at resonance and at anti-resonance is schematically shown for orientation (0°, 80°, 90°) and normalized Al thickness h=8.7% Λ, by way of example.
Figure 7B:
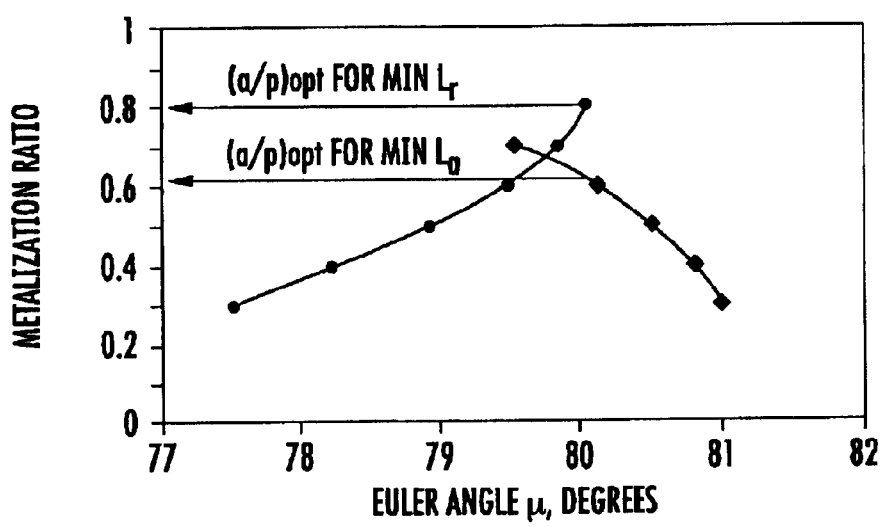
Figure 8A:
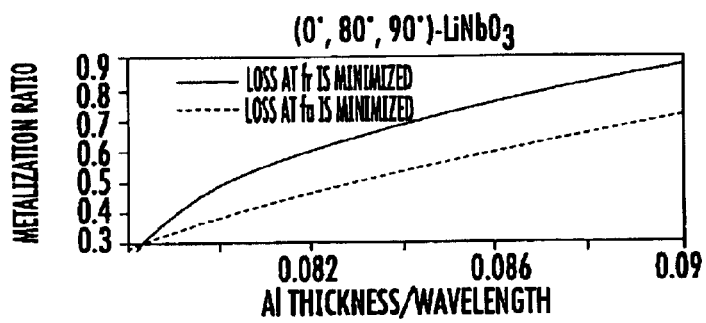
FIGS. 8A–8E graphically illustrate optimal lines for metalization ratio versus normalized Al electrode thickness for minimized propagation loss at resonance and at anti-resonance in LiNbO$_3$ orientation defined by the Euler angles (0°, 80°, 90°), and further illustrate variations of HVPSAW characteristics including velocity, propagation loss, electromechanical coupling coefficient, and temperature coefficient of frequency (TCF), respectively, along these lines as functions of the normalized Al electrode thickness.
Figure 8B:
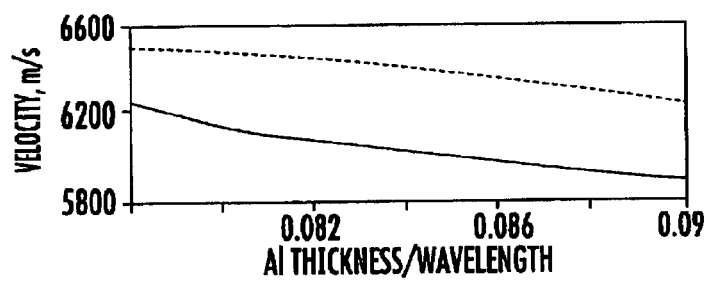
Figure 8C:
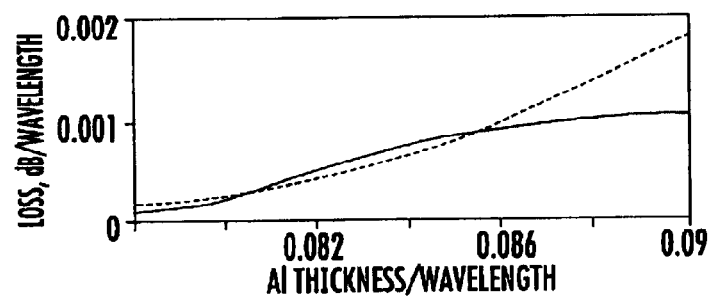
Figure 8D:
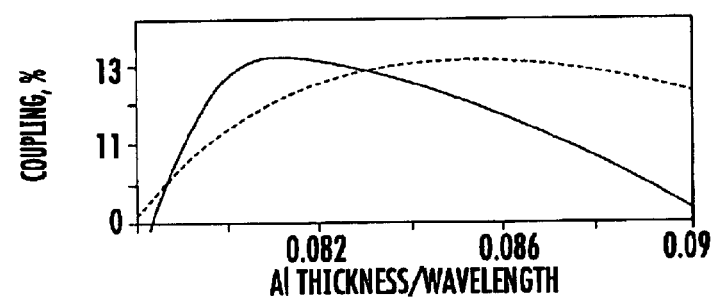
Figure 8E:
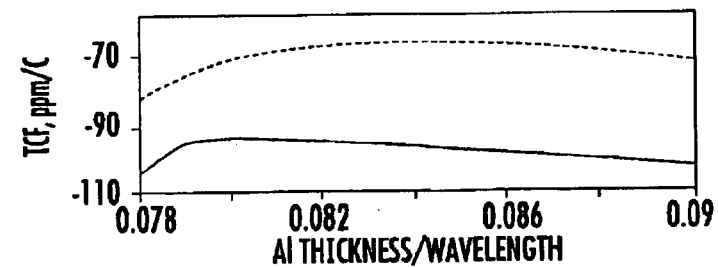

Results are illustrated with reference to FIGS. 7A and 7B illustrating optimal dependences between the Euler angle μ, normalized Al electrode thickness, and metalization ratio, respectively, which provide a propagation loss for a HVP-SAW at resonant and at anti-resonant frequencies equal to zero or less than 0.001 dB/Λ in LiNbO$_3$ having a cut orientation defined by Euler angles (0°, μ, 90°). The lines of zero propagation loss at resonance and anti-resonance do not intersect within the interval of metalization ratio from 0.2 to 0.9, which means that there is no combination of three parameters giving non-attenuated high velocity SAW. However, there is a wide area (shaded in FIG. 7A), within which the propagation losses at resonance and at anti-resonance are simultaneously less than 0.001 dB/Λ. This shaded area is located approximately between orientation values (0°, 78.5°, 90°) and (0°, 81°, 90°), with normalized Al thickness varying between 7.9% to 8.75%, and metalization ratio varying between 0.4 and 0.8. Orientation (0°, 80°, 90°) can be considered as the center of the optimal area and the best choice of orientation to provide low propagation loss (less than 0.001 dB/Λ) within a wide interval of Al thicknesses, from 7.8% Λ to 8.75% Λ. By way of example, with thickness 8.75% Λ, the optimal metalization ratios, which minimize propagation loss at resonance and at anti-resonance, can be determined from FIG. 7B as 0.8 and 0.63, respectively.

The characteristics of the HVPSAW, which propagate on a substrate having an orientation defined by Euler angles (0°, 80°, 90°), are shown in FIGS. 8A–8E. The optimal values of the metalization ratio which are required to minimize propagation loss at resonance and at anti-resonance have been determined as functions of normalized electrode thickness. As herein described by way of example, the HVPSAW characteristics of interest may include velocity, propagation loss, electromechanical coupling coefficient, and temperature coefficient of frequency (TCF) have been calculated along the optimal lines for two conditions including a minimum propagation loss at resonance frequency $L_r$ and a minimum loss at anti-resonance frequency $L_a$. Within the interval of normalized electrode thicknesses from 8% Λ to 9% Λ, the optimal metalization ratio of P-type resonators (resonators in a parallel arm of a filter), where a minimum $L_r$ is preferred, should be 1.1–1.4 times larger than the optimal metalization ratio of S-type resonators (resonators in a series arm of a filter), where a minimum $L_a$ is preferred, and while both ratios vary between 0.3 and 0.9 and increase with increasing electrode thickness. With such optimal metalization ratios, propagation losses at resonance and at anti-resonance are approximately equal and do not exceed 0.002 dB/Λ for any normalized thickness from 8% Λ to 9% Λ. A high electromechanical coupling coefficient $k^2$, about 12.5%, with propagation loss less than 0.001 dB/Λ, can be obtained in both parallel and series positioned resonators if the normalized electrode thickness is about 8.3% Λ and metalization ratios are 0.64 and 0.5, for the P-type and S-type resonators, respectively.

With an increasing Euler angle μ, propagation loss at anti-resonance grows, and with a reducing μ, propagation loss at resonance grows. By way of example, if h=8.3% Λ, propagation loss at anti-resonance reaches 0.01dB/Λ in orientation (0°, 85°, 90°) and propagation loss at resonance reaches 0.01 dB/Λ in orientation (0°, 75°, 90°). As a result, certain asymmetry can occur in the frequency response of a ladder filter. Thus the angle μ=80° provides a preferred SAW filter performance. This orientation was found to be the best one with Kushibiki's, Warner's, and Kovac's constants of LiNbO$_3$ used in calculations, even though these constants characterize LiNbO₃ crystals with slightly different properties. To provide propagation loss at resonance and at anti-resonance simultaneously less than 0.01 dB/Λ, the Euler angle $\mu$ may vary within the interval from 75° to 85°. The propagation loss less than 0.001 dB/Λ can be obtained in the interval of $\mu$ from 78.5° to 81°.

Figure 9A:
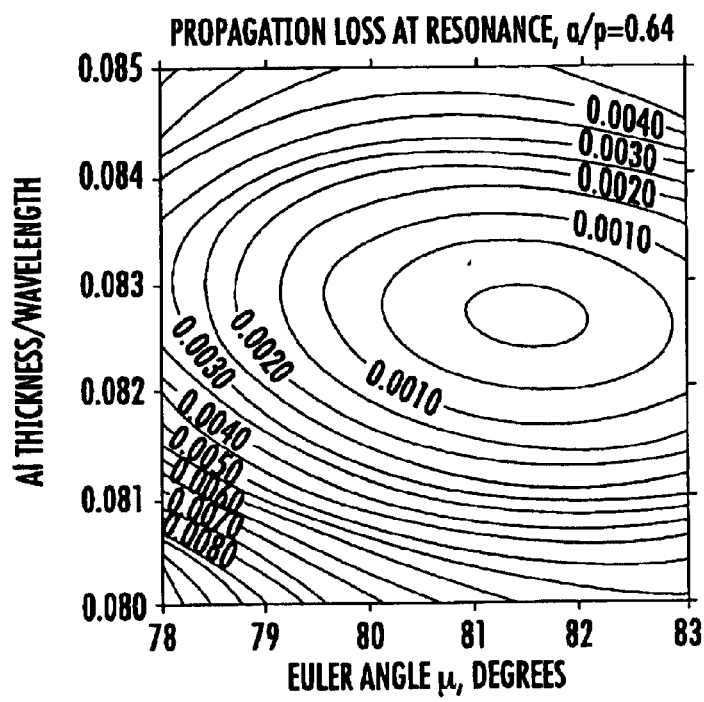
FIGS. 9A and 9B illustrate through contour plots of propagation loss, estimated at resonant and at anti-resonant frequencies, respectively, in orientations of LiNbO$_3$ defined by the Euler angles (0°, $\mu$, 90°), as functions of the Euler angle $\mu$ and normalized al electrode thickness h/Λ, wherein the propagation loss is estimated with metalization ratio 0.64 at resonance and with metalization ratio 0.5 at anti-resonance, and illustrating a minimum of propagation loss occurring at different values of angle $\mu$, but approximately at the same normalized thickness, about 8.3% Λ.
Figure 9B:
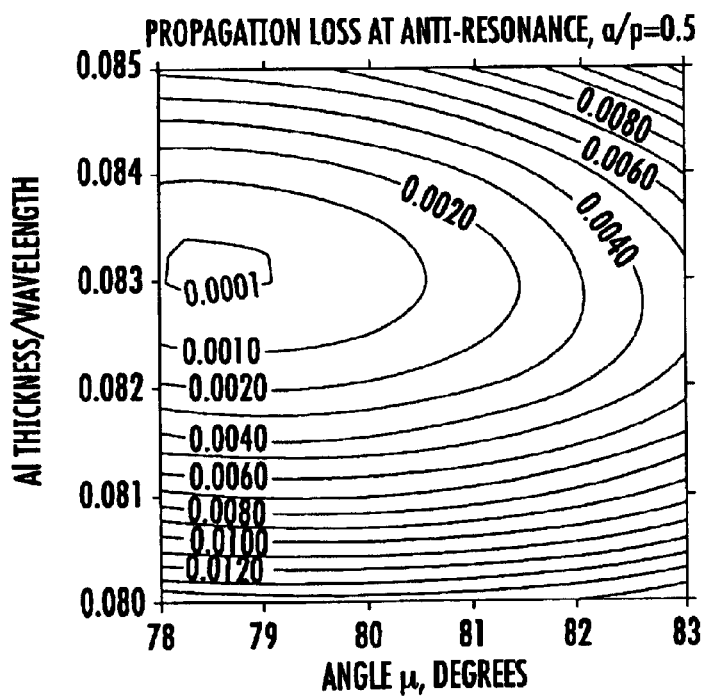
Figure 10A:
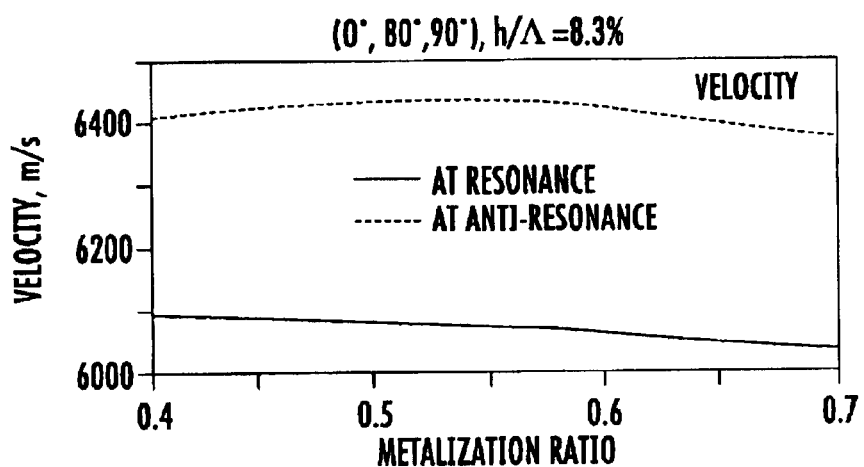
FIGS. 10A, 10B, and 10C graphically illustrate velocity, propagation loss estimated at resonant and at anti-resonant frequencies, and electromechanical coupling coefficient, respectively, as functions of metalization ratio a/p, in linbo$_3$ orientation (0°, 80°, 90°) with normalized al electrode thickness 8.3% Λ, and illustrating a minimum of propagation loss estimated at resonant and at anti-resonant frequencies occurring at a/p=0.64 and at a/p=0.5, respectively.
Figure 10B:
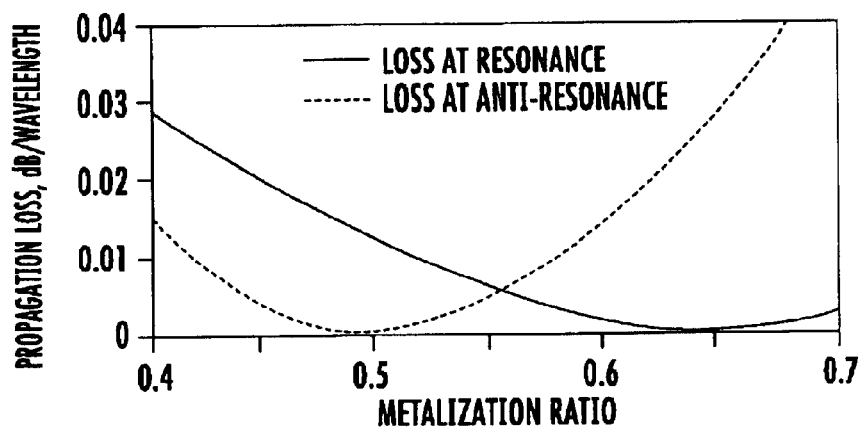
Figure 10C:
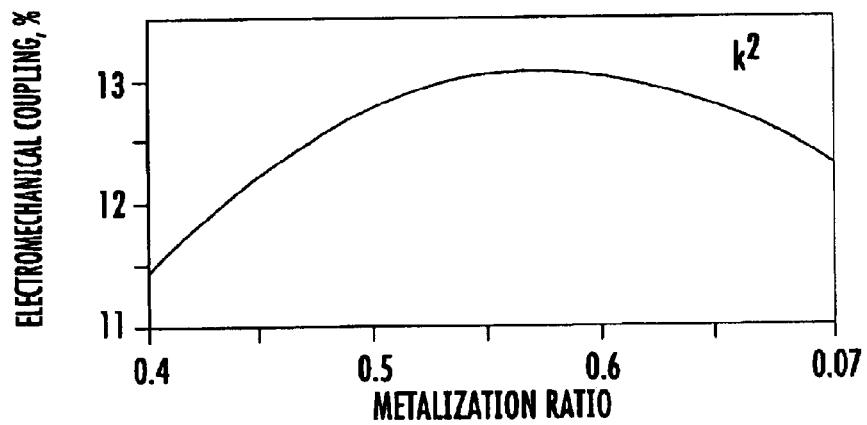

By way of further detailed discussion, FIG. 9 illustrates propagation loss in contour plots for orientations (0°, $\mu$, 90°), versus angle $\mu$ and normalized electrode thickness. By way of example, with a metalization ratio a/p=0.64 in the parallel positioned resonator and a/p=0.5 in the series position resonator, the propagation loss exhibits negligible values at approximately the same thickness, about 8.3% Λ, but at different orientations. However, this characteristic is found to be much less sensitive to the deviation of angle $\mu$, than to the deviation of the electrode thickness. As a result, with $\mu$ varying between 79.7° and 80.3° and electrode thickness 8.3% Λ, the propagation losses at resonance and at anti-resonance are less than 0.001 dB/Λ. In particular, for $\mu$=80°, both propagation losses are about 0.0005 dB/Λ. The characteristics of HVPSAW propagating in this orientation, with Al grating of normalized thickness 8.3% Λ, are illustrated with reference to FIGS. 10A–10C, as a function of metalization ratio. As illustrated, a minimum value for the propagation loss, estimated at resonant frequency, occurs at a/p=0.64, and minimum of propagation loss, and for the anti-resonant frequency, occurs at a/p=0.5.

Figure 11:
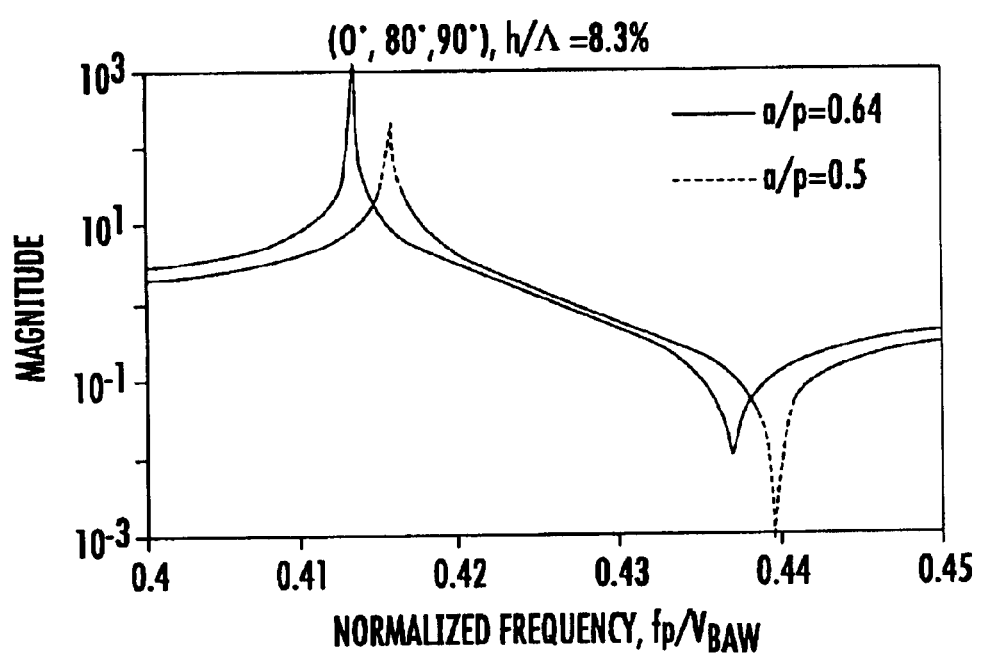
FIG. 11 illustrates an amplitude of strip admittance of an Al grating deposited on LiNbO$_3$ having an orientation described by Euler angles (0°, 80°, 90°), with normalized Al thickness 8.3% Λ, as function of normalized frequency f=fp/V$_{BAW}$, where p is a period of a grating and V$_{BAW}$ is the bulk wave velocity, and wherein two curves refer to the optimal values of metalization ratio which follow from above FIGS. A and 9B and provide minimum propagation loss at resonant and at anti-resonant frequencies.
Figure 12A:
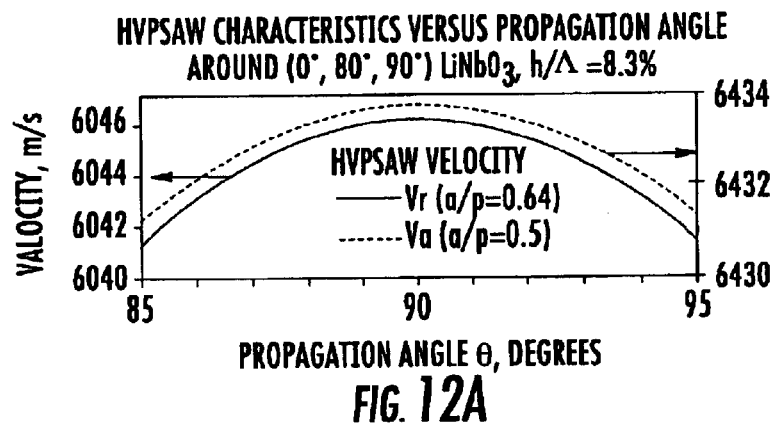
FIGS. 12A–12D graphically illustrate velocity, propagation loss, power flow angle, and electromechanical coupling coefficient, respectively, of HVPSAW propagating in LiNbO$_3$ orientations described by Euler angles (0°, 80°, θ), with normalized Al electrode thickness h=8.3% Λ, as functions of propagation angle θ, wherein the characteristics of the HVPSAW are extracted from resonance frequency for metalization ratio 0.64 and from anti-resonance frequency for metalization ratio 0.5.
Figure 12B:
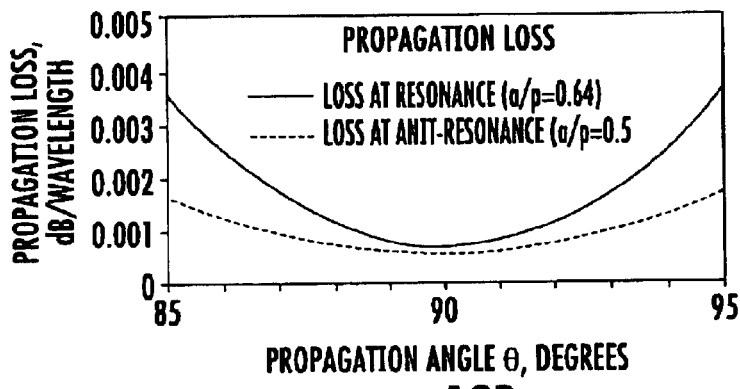
Figure 12C:
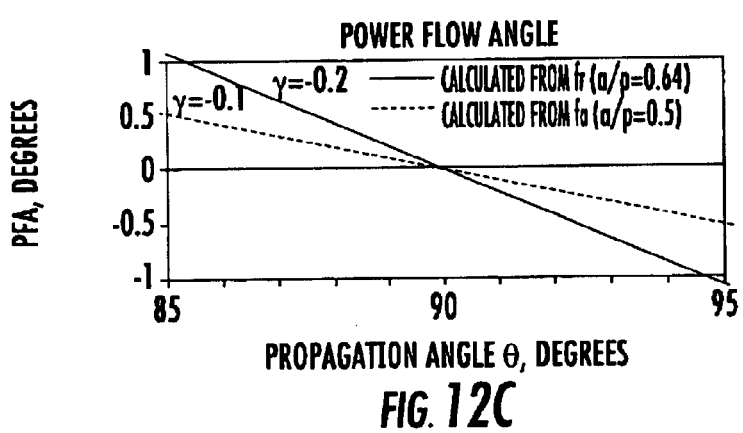
Figure 12D:
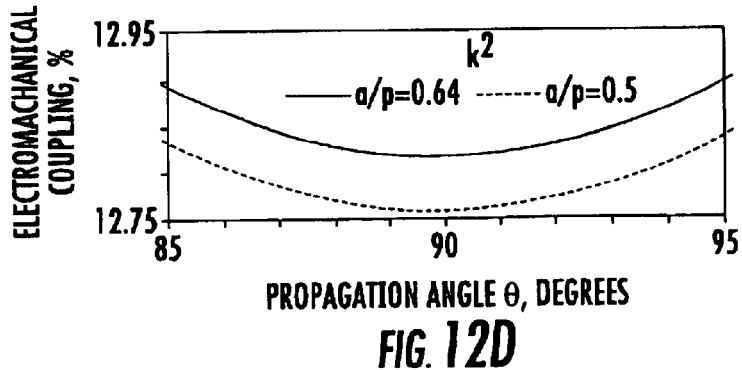

By way of example, the amplitude of strip admittance of a resonator built on a substrate having a surface cut defined by an orientation having Euler angles (0°, 80°, 90°), with normalized electrode thickness 8.3% Λ, and metalization ratios 0.64 and 0.5 is illustrated with reference to FIG. 11. The values of Q-factor are the following: $Q_r$=1300, $Q_a$=3*10⁴, when a/p=0.64, and $Q_r$=2.4*10⁴ and $Q_a$=600, when a/p=0.5. For example, in a simple ladder filter, which comprises one shunt and one series resonators, it is possible to minimize propagation loss at the lower edge of the passband using metalization ratio 0.64 in shunt resonator. Simultaneously, propagation loss can be minimized at the upper edge of the passband, if a metalization ratio of 0.5 is used in the series positioned resonator. As a result, improved shape factor can be obtained.

The sensitivity of HVPSAW characteristics to variation of the first and the third Euler angles (λ and θ) around optimal orientation (0°, 80°, 90°), while an Al grating has normalized thickness 8.3% Λ, is illustrated with reference to FIGS. 12A–12C and 13A–13B. With 5° deviation of propagation angle θ, propagation loss at resonance grows faster than that at anti-resonance (FIG. 12B), but does not exceed 0.004 dB/Λ within that deviation. The variation of velocity (FIG. 12A) is small within the analyzed interval of propagation angles. Further, the maximum power flow angle Φ (FIG. 12C) does not exceed about 1°. The power flow angle is calculated as $\Phi=(V)^{-1}\partial V/\partial\theta$, where V=$V_r$ (velocity at resonance) or V=$V_a$ (velocity at anti-resonance). The anisotropy parameter $\gamma=\partial\Phi/\partial\theta$ is negative and small and approximately −0.2 and −0.1, respectively, for estimation at resonance and at anti-resonance.

Figure 13A:
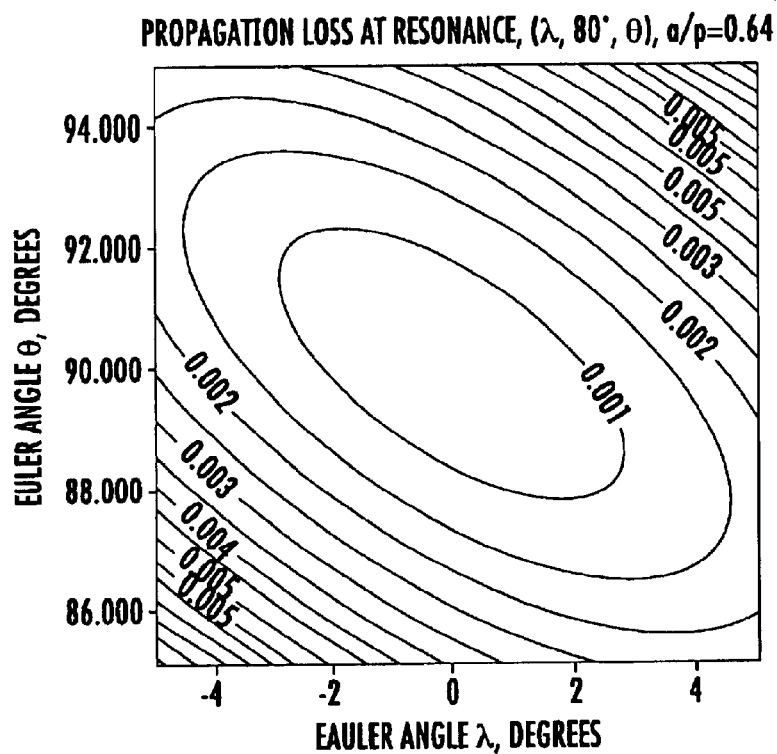
FIGS. 13A and 13B illustrate using contour plots of propagation loss in orientations of LiNbO$_3$ defined by the Euler angles (λ, 80°, θ) as functions of angles λ and θ, wherein the normalized Al electrode thickness h=8.3% Λ, and wherein the propagation loss is estimated with metalization ratio 0.64 at resonance and with metalization ratio 0.5 at anti-resonance, respectively.
Figure 13B:
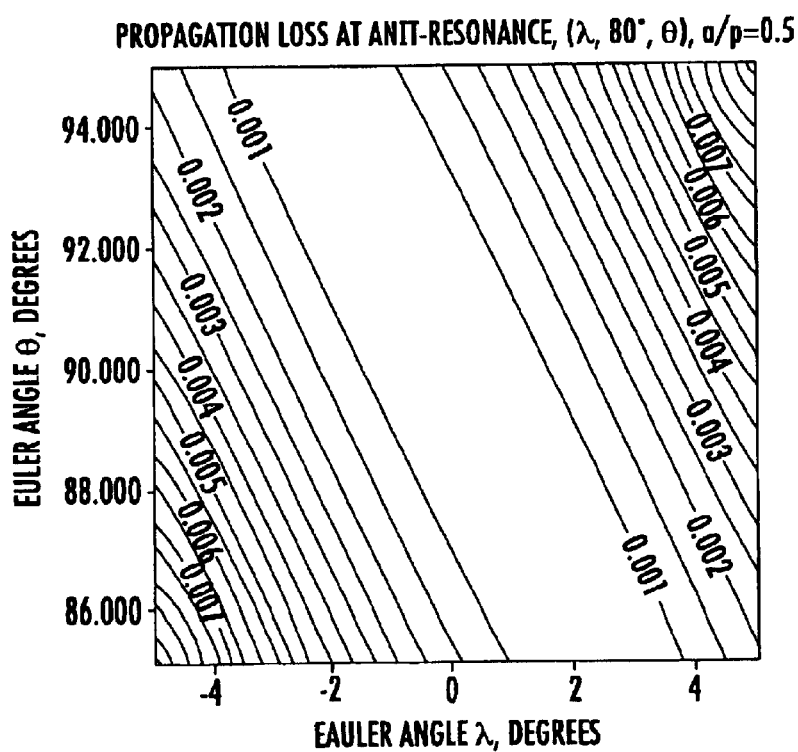

Contour plots are illustrated with reference to FIGS. 13A and 13B for propagation loss in orientations (λ, 80°, θ) versus Euler angles λ and θ, estimated at resonance (with a/p=0.64) and at anti-resonance (with a/p=0.5), respectively. With a variation of both angles within ±5° around orientation (0°, 80°, 90°), the propagation losses do not exceed 0.01 dB/Λ, which makes these orientations suitable for application in resonator type filters.

The foregoing figures were obtained with material constants reported by Kushibiki. These constants adequately describe the physical properties of LiNbO₃ single crystals with certain chemical composition ($LiO_2$ content about 48.4%). It is known that LiNbO₃ crystals may have chemical composition varying within a certain homogeneity region. Reference can be made to Kushibiki (Kushibiki et al, J.Appl. Phys., 2002, vol.91, no 10) describing analyzed material constants of LiNbO₃ dependent on chemical composition. The quality of single crystals also affects physical properties, which is demonstrated by different sets of material constants reported by different researchers. This affects all physical properties, including characteristics of HVPSAW. By way of example, with Warner constants, the optimal metalization ratios, which provide minimum propagation loss in orientation (0°, 80°, 90°), while normalized electrode thickness is 8.3% Λ, are 0.57 for minimum loss at resonance, and 0.43 for minimum loss at anti-resonance. However, both values are between 0.3 and 0.9, and their ratio generally remains between 1.1 and 1.4, providing propagation loss at resonance and at anti-resonance less than 0.0001 dB/Λ.

Thus, according to the foregoing results, an optimal area of orientations for resonator type filters, utilizing HVPSAW in LinbO3 single crystals, is defined by the Euler angles (λ, $\mu$, θ), where the angle λ are found to be greater than −5° and smaller than 5°, the angle $\mu$ was found to be greater than 75° and smaller than 85°, and the angle θ was found to be greater than 85° and smaller than 95°, while the optimal normalized thickness of electrode grating, with Al as a primary component of electrode material, changes within the range from 8% Λ to 9% Λ, metalization ratio of the resonators changes from 0.3 to 0.9, and a metalization ratio for resonators used within a parallel arm (P-type) of a SAW filter, which provides minimum propagation loss at resonant frequency, is 1.1–1.4 times larger than metalization ratio of resonators used within a series arm (S-type) of the SAW filter, which provides minimum propagation loss at anti-resonant frequency. One preferred embodiment of the present invention has orientation Euler angles (0°, 80°, 90°), with nominal Al electrode thickness 8.3% Λ and nominal metalization ratios in P-type and S-type resonators are 0.64 and 0.5, respectively. Further, preferred embodiments may include temperature compensation of the resonator filters as above described.

It is to be understood that even though numerous characteristics and advantages of the present invention have been set forth in the foregoing description, together with details of the structure and function of the invention, the disclosure is illustrative only, and changes may be made in detail, especially in the choice of SAW device, device orientation on the die, and shape size and arrangement of parts within the principles of the invention to the full extent indicated by the broad general meaning of the terms in which claims may be expressed.

That which is claimed is:

1. A SAW filter comprising:
   a piezoelectric substrate of a single crystal LiNbO₃ having a SAW propagation surface defined by orientation Euler angles (λ, $\mu$, θ), with angle λ having a value in a range from −5° to 5°, angle $\mu$ having a value in a range from 75° to 85°, and angle θ having a value in a range from 85° to 95°; and
   at least one first SAW resonator affixed to the propagation surface in at least one parallel arm of the filter and at least one second SAW resonator affixed to the propagation surface in at least one series arm of the filter, wherein electrodes forming each of the at least one first and second resonators have a metalization ratio in a range of 0.3 to 0.9 and a thickness in a range of 8% Λ to 9% Λ, where Λ is an acoustic wavelength of a SAW excited on the piezoelectric substrate, and wherein the metalization ratio for the first resonator in the parallel arm is 1.1 to 1.4 times larger than the metalization ratio for the resonator in the series arm.

2. The SAW filter according to claim 1, wherein the Euler angle μ ranges from 78.5° to less than 81°.

3. The SAW filter according to claim 1, wherein a propagation loss at a resonance frequency of the at least one first SAW resonator and a propagation loss at an anti-resonance frequency of the at least one second SAW resonator is less that 0.01 dB/Λ.

4. The SAW filter according to claim 3, wherein the propagation loss at the resonance frequency and the anti-resonance frequency for at least one of the first and second SAW resonators is less that 0.01 dB/Λ.

5. A SAW filter comprising:
a piezoelectric substrate of a single crystal $LiNbO_3$ having a SAW propagation surface defined by orientation Euler angles (λ, μ, θ), with angle λ having a value in a range from −5° to 5°, angle μ having a value in a range from 75° to 85°, and angle θ having a value in a range from 85° to 95°; and
at least one first SAW resonator affixed to the propagation surface in at least one parallel arm of the filter, and at least one second SAW resonator affixed to the propagation surface in at least one series arm of the filter, so as to form a ladder filter thereof,
wherein a resonance frequency of the first SAW resonator and an anti-resonance frequency of the second SAW resonator provides are selected so as to provide a propagation loss for the filter of less that 0.01 dB/Λ.

6. The SAW filter according to claim 5, wherein the Euler angle μ ranges from 78.5° to less than 81°.

7. The SAW filter according to claim 5, wherein the propagation loss at the resonance frequency and the anti-resonance frequency for at least one of the first and second SAW resonators is less that 0.001 dB/Λ.

8. The SAW filter according to claim 5, wherein electrodes forming each of the at least one first and second resonators have a metalization ratio in a range of 0.3 to 0.9.

9. The SAW filter according to claim 5, wherein the metalization ratio for the at least one first resonator in the parallel arm is 1.1 to 1.4 times larger than the metalization ratio for the at least one second resonator in the series arm.

10. The SAW filter according to claim 5, wherein an electrode thickness for each of the at least one first and second resonators is within a range of 8% Λ to 9% Λ, where Λ is an acoustic wavelength of a SAW excited on the piezoelectric substrate.

11. The SAW filter according to claim 5, wherein electrodes forming each of the at least one first and second resonators have a metalization ratio in a range of 0.3 to 0.9 and a thickness in a range of 8% Λ to 9%, Λ, where Λ is an acoustic wavelength of a SAW excited on the piezoelectric substrate, and wherein the metalization ratio for the first resonator in the parallel arm is 1.1 to 1.4 times larger than the metalization ratio for the second resonator in the series arm.

12. A SAW filter comprising:
a piezoelectric substrate of a single crystal $LiNbO_3$ having a SAW propagation surface defined by orientation Euler angles (λ, μ, θ), with angle λ having a value in a range from −5° to 5°, angle μ having a value in a range from 75° to 85°, and angle θ having a value in a range from 85° to 95°; and
at least one first SAW resonator affixed to the propagation surface in at least one parallel arm of the filter, and at least one second SAW resonator affixed to the propagation surface in at least one series arm of the filter, so as to form a ladder filter thereof,
wherein electrodes forming each of the at least one first and second resonators have a metalization ratio in a range of 0.3 to 0.9.

13. The SAW filter according to claim 12, wherein the Euler angle μ ranges from 78.5° to less than 81°.

14. The SAW filter according to claim 12, wherein a resonance frequency of the first SAW resonator and an anti-resonance frequency of the second SAW resonator provides are selected so as to provide a propagation loss for the filter of less that 0.01 dB/Λ.

15. The SAW filter according to claim 14, wherein the propagation loss at the resonance frequency and the anti-resonance frequency for at least one of the first and second SAW resonators is less that 0.01 dB/Λ.

16. The SAW filter according to claim 12, wherein an electrode thickness for each of the at least one first and second resonators is within a range of 8% Λ to 9% Λ, where Λ is an acoustic wavelength of a SAW excited on the piezoelectric substrate.

17. The SAW filter according to claim 16, wherein the metalization ratio for the at least one first resonator in the parallel arm is 1.1 to 1.4 times larger than the metalization ratio for the at least one second resonator in the series arm.

* * * * *